United States Patent [19]

Terneu et al.

[11] 4,329,379
[45] May 11, 1982

[54] PROCESS FOR FORMING TIN OXIDE GLASS COATING

[75] Inventors: Robert Terneu, Thimeon; Albert Van Cauter, Charleroi, both of Belgium

[73] Assignee: BFG Glassgroup, Paris, France

[21] Appl. No.: 85,475

[22] Filed: Oct. 17, 1979

[30] Foreign Application Priority Data

Oct. 19, 1978 [GB] United Kingdom .............. 41164/78

[51] Int. Cl.³ .............................................. B05D 5/06
[52] U.S. Cl. ................................... 427/166; 65/60 A; 65/60 D; 427/255; 427/314; 427/419.3
[58] Field of Search ................. 427/255, 255.1, 255.7, 427/226, 350, 314, 419.2, 419.3, 255.4, 255.3, 166; 428/432, 539; 65/60 D, 60 B, 60 C, 60 A

[56] References Cited

U.S. PATENT DOCUMENTS

| | | | |
|---|---|---|---|
| 2,617,741 | 11/1952 | Lytle | 427/314 |
| 3,379,559 | 4/1968 | Gerhardt | 427/255 |
| 3,415,677 | 12/1968 | Moser et al. | 65/60 A |
| 3,463,658 | 8/1969 | Budd | 427/226 |
| 3,561,940 | 2/1971 | Scholes | 427/255 |
| 3,656,922 | 4/1972 | Budd | 65/60 A |
| 3,841,858 | 10/1974 | Akashi et al. | 65/60 B |
| 3,850,665 | 11/1974 | Plumat et al. | 65/60 D |
| 3,852,098 | 12/1974 | Bloss | 427/255 |
| 3,876,410 | 4/1975 | Scholes | 427/255 |
| 3,887,349 | 6/1975 | Akashi et al. | 65/60 D |
| 3,950,596 | 4/1976 | Carr et al. | 427/255 |
| 4,148,940 | 4/1979 | Breininger et al. | 427/255 |
| 4,170,460 | 10/1979 | Donley | 427/226 |

FOREIGN PATENT DOCUMENTS

| | | | |
|---|---|---|---|
| 572631 | 11/1958 | Belgium | 427/255 |
| 2268571 | 12/1975 | France | 427/255 |

*Primary Examiner*—S. L. Childs
*Attorney, Agent, or Firm*—Spencer & Kaye

[57] ABSTRACT

A tin oxide coating is formed on a hot glass substrate during conveyance through two successive coating zones in the first of which it is contacted with an acetylacetonate or alkylate of titanium, nickel or zinc to cause deposition of a metal oxide undercoating on the substrate, and in the second of which zones such metal oxide coating on the still hot substrate is contacted by a gaseous medium comprising a tin halide to cause deposition of a coating of tin oxide.

26 Claims, 1 Drawing Figure

U.S. Patent      May 11, 1982      4,329,379
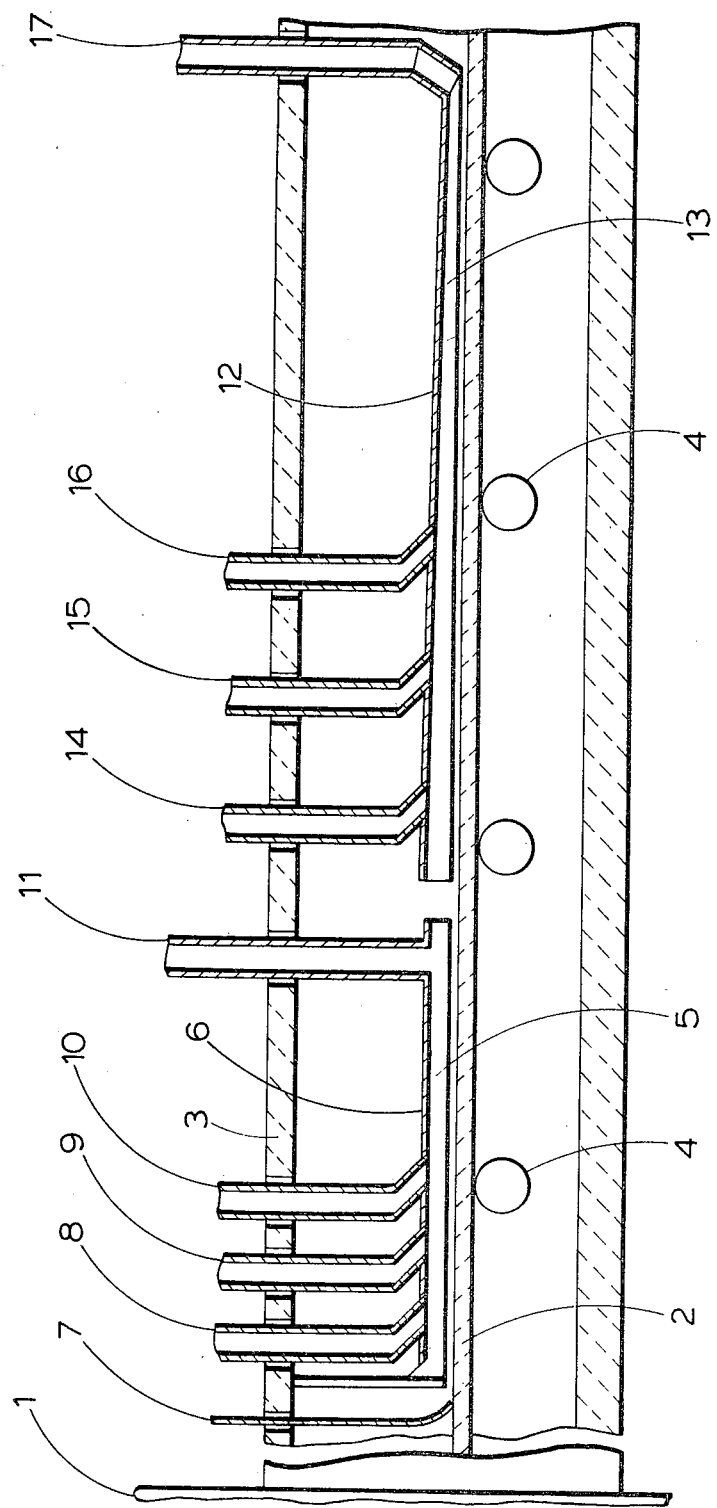

PROCESS FOR FORMING TIN OXIDE GLASS COATING

BACKGROUND OF THE INVENTION

This invention relates to a process of forming a tin oxide coating on a hot glass substrate by chemical reaction and/or decomposition of tin halide supplied in the vapour phase.

There is a demand for glass products, in particular flat glass, having a tin oxide coating of high optical quality which modifies the radiation transmitting characteristics of the product but causes little or no diffusion of transmitted light. Any significant light diffusion within a transparent product is apparent as haze.

In the prior art it is recognised that the appearance of haze in coatings formed on glass by exposure to tin halide can be caused by alkali metal salt reaction products of the glass with the tin halide. In order to inhibit such reactions U.S. Pat. No. 2,617,741 proposed to precede the formation of the tin oxide coating by the formation of a protective layer which is free of $Na_2O$ or which has a content of available $Na_2O$ lower than that of the surface of the heated glass. The protective layer is formed, according to that United States Patent, by spraying the heated glass with a saturated or relatively concentrated aqueous solution of a suitable soluble metal salt, those mentioned including salts of copper, aluminium, lead, zinc, iron, nickel, cobalt, thalinum, silver and titanium. The United States specification states that the chlorides, bromides, iodides, nitrates and nitriles of those metals can be used but that clearest films are obtained when using the acetates.

It is a fact that haze can result from reactions between the tin halide and the glass substrate and that such undesirable reactions can be prevented or reduced by application of an intervening coating of suitably selected composition. But haze can of course occur which has other causes such as defects in the structure of the tin oxide coating or of the subjacent protective coating itself, if applied. Obviously it will be a normal objective to control coating conditions to try to achieve coatings which are as uniform in thickness and composition as possible.

Notwithstanding the application of a protective coating beneath the tin oxide coating and careful control of coating procedures the problem of haze formation persists. The problem varies in severity depending on numerous factors. These include the environmental conditions under which coating takes place, the coating thickness and the rate of its formation measured in terms of the growth in the coating thickness per unit time.

The aforesaid United States patent is concerned with the formation of electro-conductive coatings on glass sheets. Electro-conductive coatings are referred to which have a thickness of about 3000 to 4000 Å. Research has shown that the difficulty of avoiding haze tends to increase as the coating thickness and the coating rate increase. The coating rate is of course an important factor in an industrial mass production plant. This is particularly so if it is required to coat a glass ribbon during its transit from a flat glass forming station.

SUMMARY OF THE INVENTION

The present invention aims to provide a process whereby tin oxide coatings with very low light-diffusing power can be formed more easily than by the prior art processes. In particular it is an object of the invention to provide such a process the efficacy of which is less dependent on the coating thickness and the rate of its formation and which lends itself to use in a continuous manner for coating continuously moving glass ribbons.

According to the present invention there is provided a process of forming a tin oxide coating on a hot glass substrate by chemical reaction and/or decomposition of tin halide supplied in the vapour phase characterised in that the hot substrate is conveyed through two successive coating zones in the first of which it is contacted with an acetylacetonate or alkylate of titanium, nickel or zinc to cause deposition of a metal oxide undercoating on the substrate, and in the second of which zones such metal oxide coating on the still hot substrate is contacted by a gaseous medium comprising a tin halide to cause deposition of a coating of tin oxide.

By this process coatings of a high optical quality, in particular of high luminous transmission and very low light-diffusing power can be formed more easily or reliably and/or under a wider range of conditions than hitherto possible. In particular it has been found that by a process according to the invention tin oxide coatings of a thickness in excess of 6000 Å and even in excess of 7000 Å can be formed whose light-diffusing power, expressed as the percentage of transmitted light which is diffused, is less than 2%.

The process is applicable for coating a continuously moving ribbon of glass in course of its travel from a forming station, e.g. from a drawing machine or from a float tank.

While the present invention is not dependent on any theory of the coating process it appears that the structure of the tin oxide coating is influenced by the underlayer in a way which promotes an isotropic crystalline arrangement in the tin oxide coating indicative of preferential crystal growth in a direction normal to the substrate surface. This may be largely due to a similarity between the crystallographic systems of the superimposed coatings. Another influential factor may be the sizes of the crystals of the underlayer. For given environmental temperature conditions the selection of the material from which the undercoating is formed in accordance with the invention is favourable to the formation of a large number of very small crystals which appears in turn to have a beneficial influence on the structure of the superimposed tin oxide coating. Additionally, the undercoating protects the glass from chemical reactions which may themselves be liable to cause haze. And the formation of the undercoating from a compound selected from those above specified is favourable for avoiding the incidence of light-diffusing conditions at the undercoating/glass interface.

BRIEF DESCRIPTION OF THE DRAWING

The sole FIGURE shows a cross sectional side elevation of an end of a float tank from which a glass ribbon travels through a gallery while supported on rollers.

DESCRIPTION OF THE PREFERRED EMBODIMENTS

In preferred processes according to the invention the first and second coating zones are arranged close together along the path of conveyance of the substrate so that deposition of the overcoating on any given region along the substrate occurs immediately after deposition of the undercoating on that region. The formation of the undercoating and top coating in immediate succession is conducive to the highest coating quality standards and the coating process can be performed in a conveniently small space volume.

Preferably the metal compound supplied to the first zone to bring about deposition of the undercoating is an acetylacetonate. The acetylacetonates are particularly advantageous because they lead to the formation of an undercoating composed of a large number of very small crystals which is a condition helpful to the formation of a superimposed tin oxide coating having a high proportion of favourably oriented crystals. The acetylacetonates will yield undercoatings of favourable crystallographic characteristics for promoting preferential growth of the subsequently formed tin oxide crystals in a direction normal to the substrate. The acetylacetonates have the additional advantage that they are not susceptible to hydrolysation and can be supplied to the substrate in a moist environment without giving rise to premature decomposition.

The alternative to using an acetylacetonate of the selected metal for the undercoat precursor is to employ an alkylate. The alkylates also yield undercoatings composed of a large number of small crystals. When an alkylate is used the environment in the coating zone should be dry. Examples of alkylates which can be used include the ethylates, propylates and butylates of titanium and of nickel.

In the most preferred processes according to the invention the compound constituting the precursor of the metal oxide undercoating is a titanium acetylacetonate. Such compounds show to a very marked degree the above mentioned advantages associated with acetylacetonates, and they can be easily formed.

The preferred top coating precursor is tin tetrachloride. This compound can be vaporised very easily and gives the best results.

Preferably the gaseous medium comprising a tin halide is caused to flow along the undercoated substrate face as a substantially turbulence-free layer. This condition assists the formation of a uniform coating.

The gas flow is considered substantially turbulence-free if it is substantially free of local circulating currents or vortices giving rise to a substantial increase in the flow resistance. In other words, the flow is preferably laminar but undulation of the gaseous medium or minor eddy currents can be tolerated provided that the metal oxide which is to form the coating is formed substantially only at the boundary layer between the gas stream and the hot undercoated substrate and is not to any significant extent formed as a precipitate within the stream.

Advantageously the acetylacetonate or alkylate undercoat precursor is also supplied to the substrate in the gaseous phase. Generally speaking the required results can be achieved more easily by using the acetylacetonate or alkylate in gaseous form. It is easier to control the supply of the medium to the coating zone to maintain uniform conditions.

The best procedure, is to cause vaporous undercoat precursor to flow along the glass substrate face to be coated as a substantially turbulence-free layer. As in the case of the top coating, this condition assists the formation of a uniform coating over the whole substrate area to be coated. Preferably the vapour is caused to flow along the substrate face as a substantially turbulence-free layer along a flow passage which is defined in part by the face of the glass and which leads towards an exhaust ducting via which residual vapour is drawn away from such face.

The avoidance of spurious deposits of the undercoat oxide are more easily avoided if the flow passage within which the coating is formed is shallow. Preferably the height of the flow passage measured normally to the substrate face is at no point in excess of 40 mm.

The most beneficial way of carrying out the present invention is to supply both the undercoat and the overcoat precursors in the gaseous phase, to cause the two gaseous media to flow along successive portions of a flow passage defined in part by the substrate face to be coated, and to withdraw gaseous medium remaining from the first coating stage from such passage at a position between the two coating zones. The two oxide coatings can in this way be very conveniently formed under conditions which favour a high degree of coating uniformity. Preferably residual gaseous medium at the downstream end of the second coating zone is withdrawn away from the coated substrate. This withdrawal is advisable for avoiding spurious surface deposits on the formed tin oxide coating by precipitation from the environment. However should any such deposits be present following performance of the invention they can be removed by subjecting the coated substrate to a surfacing treatment, e.g. of a mechanical nature.

Advantageously the acetylacetonate or alkylate fed towards the first coating zone is directed along a path which is inclined towards the substrate to be coated, preferably at an angle of 45° or less. If the gas stream is supplied from such an inclined path into a flow passage extending along the face as above referred to, the required non-turbulent flow of gaseous medium along that passage is promoted.

In certain embodiments of the invention the metal oxide undercoat forms as a result of decomposition of the acetylacetonate or alkylate precursor compound. It is possible for the metal oxide undercoating to form merely by pyrolysis, without supplying any reactive substance to the coating zone together with such precursor. But it is preferable to supply the undercoat precursor to the first coating zone together with oxygen (e.g. together with air) which makes possible or which assists the formation of the oxide. Regardless of whether or not oxygen is supplied to the first coating zone a stream of an inert gas, e.g. nitrogen, can be employed in order to form a screen which excludes the entry of ambient air to the coating zone should that be required.

The invention includes processes in which the acetylacetonate or alkylate undercoat precursor is supplied in solution to the first coating zone. When a solution is employed it is preferable to supply the solution to such coating zone in the form of droplets. For example use can be made of an atomising gun fed separately with compressed air and the solution of the metal compound selected as the undercoat precursor.

For forming a solution of an acetylacetonate of titanium, nickel or zinc, it is advantageous to employ an aprotic solvent having a dipolar moment greater than 3 Debye Units, a substituted or unsubstituted monocarboxylic acid solvent, an amine or diamine solvent, or a mixture of two or more solvents selected from solvents of those classes. The term "aprotic solvent" means a solvent which is not able to form strong hydrogen bonds with appropriate anions (following the classification of A. J. Parker in "The Effects of Solvation on the Properties of Anions in Dipolar Aprotic Solvents" published in "Quarterly Reviews" 16, (1962), p. 163). Thus solvents with dielectric constants greater than 15, which cannot donate suitably labile hydrogen atoms to form strong hydrogen bonds with an appropriate species, are classed as dipolar aprotic solvents, even though they may contain active hydrogen atoms. The choice of a solvent from the above mentioned categories is recommended because they are conducive to the formation of metal oxide coatings which are of substantially uniform thickness and composition. But the specified solvents are nevertheless only examples of those which can be used with good results.

The thickness of the undercoat is not critical but it is advisable for it to be as thin as possible consistent with formation of a continuous and effective protective layer between the glass substrate and the subsequently deposited tin oxide. Thicker undercoats than are required for this purpose can be formed but in that case the formation of a good quality undercoat which exhibits little or no light-diffusing characteristics is more closely dependent on environmental coating conditions, for example on the temperature conditions.

Preferably the thickness of the undercoat is below 2000 Å, and most advantageously below 500 Å. Preferably the thickness of the undercoat lies between 300 Å and 400 Å.

The temperature of the glass substrate at the two coating zones is preferably in the range 520° to 630° C. At such temperatures the metal oxide forms at the glass surface immediately on its exposure to the fluid medium supplied to the coating zones.

Preferably the temperature of the coated substrate at the second coating zone is above 550° C. The substrate will normally undergo some local cooling at the first coating zone and this should be taken into account in determining the appropriate distance, measured along the path of the substrate, between the first and second coating zones. This distance should be such in relation to the speed of the substrate that following application of the undercoat to a given region of the substrate, the interval of time before the top coat is applied is sufficient for the temperature of that region of the glass to equilibrate with hotter neighbouring regions.

Generally, the temperature of the gaseous or liquid precursor is likewise not critical. It should have a temperature low enough to avoid premature formation of solid material by decomposition or chemical reaction but high enough to ensure virtually instantaneous formation of deposit on contact with the hot substrate. The most suitable temperature for the or each fluid stream can easily be ascertained by tests.

For the undercoating, when using a vaporous precursor introduced in an inert gas very good results have been achieved when pre-heating the gas stream so that its temperature immediately prior to reaching the coating zone is in the range 200° to 300° C., the optimum range being 250° to 280° C. When using air as the carrier gas for the vaporous precursor the temperature should be low enough to avoid premature reactions. For example when feeding titanium acetylacetonate in air, the gas stream can be preheated to about 200° C. When applying coating precursor in the liquid phase, it is suitable to spray the liquid at room temperature.

In certain processes according to the invention the gaseous medium which is brought into contact with the undercoated substrate in the second coating zone contains tin tetrachloride in a concentration corresponding to a partial pressure of at least $2.5 \times 10^{-3}$ atm. and contains water vapour in a concentration corresponding to a partial pressure of at least $10 \times 10^{-3}$ atm., and has been pre-heated to a temperature of at least 300° C., and the temperature of the glass at the second coating zone is above 550° C. Such a method of forming a tin oxide coating is in accordance with the invention which is the subject of our co-pending U.S. patent application Ser. No. 49,155 of June 18, 1979. When observing the specified conditions with regard to the supply of tin tetrachloride and water vapour a tin oxide coating of good optical quality in terms of freedom from internal haze can be formed at higher deposition rates than would otherwise be possible.

The preferred tin tetrachloride partial pressure range is from $2.5 \times 10^{-3}$ to $10^{-2}$ atm. By working within this range tin oxide deposition rates above 2000 Å/sec. can be achieved with high process efficiency in terms of the proportion of tin tetrachloride which becomes converted to form the tin oxide coating.

In the foregoing description the processes more particularly in view are processes wherein a single acetylacetonate or alkylate and a single tin halide are employed for forming the undercoating and top coating. It is to be understood that it is within the scope of the invention for the medium supplied to either or both coating zones to comprise a combination of different coating precursors. For example a mixture of acetyl acetonates of different metals of the group titanium, nickel and zinc can be used for forming an undercoating comprising oxides of different such metals.

One or more substances additional to the compound or compounds from which the metal oxide or metal oxides is or are formed can be supplied to either or both coating zones for the purpose of modifying the composition of the undercoating and/or the top coating. For example a doping agent may be supplied to the second coating zone separately from or together with the precursor(s) from which the metal oxide or oxides is or are formed, in order to form a metal oxide top coating having a lower emissivity, i.e., a higher reflectivity in respect of radiation in the far infrared region of the electromagnetic spectrum.

The preferred applications of the invention are those in which the process is applied for coating a continuous ribbon of glass in course of its conveyance from a flat glass forming station. Particularly important are processes according to the invention wherein the glass substrate is a ribbon of float glass travelling from a float tank.

The following are examples of processes according to the invention.

EXAMPLE 1

A ribbon of float glass was coated by means of a coating apparatus installed between the float tank and an annealing lehr. The apparatus is represented in the accompanying diagrammatic drawing. The drawing is a cross-sectional side elevation showing an end of the float tank 1 from which a glass ribbon 2 travels through a horizontal gallery 3 while supported on rollers 4. Adjacent the exit end of the float tank there is a first coating station at which an undercoat is formed on the top face of the glass ribbon by deposition from a fluid coating medium which is caused to flow along a shallow passage 5 defined by the glass ribbon and a hood 6 which bridges the path of the glass ribbon. The entry end of the flow passage 5 is closed by means of a refractory curtain 7 made of the material marketed under the trade mark Refrasil by the Chemical and Insulating Co., Ltd., Darlington, England. Refrasil is composed mainly of $SiO_2$ with small amounts of other metal oxides. There are three feed conduits 8, 9 and 10 via which streams of fluid medium can be delivered. The lower end portions of those conduits are inclined downwardly and forwardly in the direction of travel of the glass ribbon, at an angle of 45° to the horizontal. The conduits 8, 9 and 10 are of elongate rectangular cross-section in horizontal planes, their width (measured normally to the plane of the drawing) extending across the width of the ribbon path. At the downstream end of the first coating station, i.e. at the right hand end of the flow passage 5, there is a chimney 11 via which surplus fluid medium is drawn away from the glass ribbon.

The horizontal distance between the refractory curtain 7 and the discharge end of conduit 10 is about 40 cm and the horizontal distance from that discharge end to the chimney 11 is likewise about 80 cm. The height of the flow passage 5 is about 30 mm at its entry end and about 10 mm at its other end where the chimney 11 is located.

Downstream from the first coating station there is a second coating station at which a tin oxide coating is formed on the undercoating. A hood 12, similar to hood 6 but appreciably longer, defines with the glass ribbon a flow passage 13 into which fluid media are introduced via three feed conduits 14, 15, 16 the lower end portions of which are likewise inclined downwardly and forwardly into communication with the passage 13. These conduits are also formed to deliver fluid streams over the full width of the path of the glass ribbon. At the downstream end of the second coating station there is a chimney 17 via which surplus fluid medium is drawn away from the glass ribbon. The horizontal distance between the discharge end of conduit 16 and the chimney 17 is about 2 meters. The height of the flow passage 13 is about 40 mm at its entry and 10 mm at its exit end.

In the process according to this example, the speed of the glass ribbon through the coating station was 12 meters per minute, and the temperature of the ribbon at the entry to the first coating station was of the order of 600° C.

A stream of nitrogen was fed continuously into the flow passage 5 via the first feed conduit 8. This nitrogen stream served as a pneumatic screen for isolating the downstream part of the flow passage 5 from atmospheric air at the upstream end of the coating station. Titanium acetylacetonate vapour in a carrier stream of nitrogen gas was continuously introduced into the flow passage 5 at a temperature of 275° C. via the second feed conduit 9.

The gas stream supplied through conduit 9 was formed in the following manner: Titanium tetraisopropylate and acetylacetone were mixed in proportions of 1 mole of the alkylate for 2 moles of acetylacetone. These compounds reacted to give a mixture of titanium di-isopropyoxydiacetylacetonate and isopropanol, which reaction product was liquid at ambient temperature. A stream of pre-heated nitrogen was bubbled through the liquid and caused vaporisation of titanium acetylacetonate (or more precisely titanium isopropoxyacetylacetonate) and entrainment of this vapour in the escaping nitrogen stream.

A stream of air at 275° C. was continuously fed into the flow passage 5 via the third feed conduit 10.

In the first coating zone, disposed between the exit end of the conduit 10 and the chimney 11, a coating of titanium dioxide having a thickness of 800 Å was formed on the glass ribbon.

From the first coating station the glass ribbon, now at a temperature of 580° C., passed into the second coating station for formation of the tin oxide coating on top of the titanium dioxide undercoating.

Nitrogen pre-heated to 500° C. was fed from a source (not shown) along the conduit 14 so as to serve as a kind of pneumatic screen isolating the passageway 13 from the gases located in the gallery 3 and externally of the hood 12.

Tin tetrachloride vapour entrained in a stream of nitrogen at 450° C. was fed continuously along conduit 15 so as to discharge as a stream flowing along the passageway 13. The tin tetrachloride vapour was formed by spraying liquid tetrachloride into a pre-heated stream of nitrogen.

The conduit 16 was continuously supplied with a gas mixture at 450° C. and comprising air, water vapour and hydrofluoric acid. The purpose of the hydrofluroic acid was to dope with fluorine ions the coating forming on the glass ribbon so as to increase the far infrared reflectivity of the coating. The supply of gas through conduit 16 helped to move or press the reactive stream containing tin tetrachloride towards the surface of the glass.

As a result of the continuous delivery of gas streams as above described into the passage 13 there was maintained in the downstream end portion of this passage, between the discharge end of conduit 16 and the chimney 17, a gas stream containing tin tetrachloride and water vapour (together with hydrofluoric acid). This gas mixture formed a substantially turbulence-free layer. The relative quantities of the different gases feeding into the passage 13 from the conduits 14, 15, 16 per unit time were such as to maintain in the passage 13, at the level of the glass, after the slot-like discharge orifice of duct 16, a tin tetrachloride partial pressure of $5 \times 10^{-3}$ atm. and a water vapour partial pressure of $125 \times 10^{-3}$ atm. Surplus gases were continuously exhausted from the coating site via the chimney 17.

A coating of $SnO_2$ doped with fluorine and having a thickness of 7500 Å, measured by means of a mechanical sensor, was formed on the glass ribbon in the second coating zone disposed between the exit end of conduit 16 and the chimney 17. The coating was free from any haze detectable by the naked eye, the visible light-diffusing power of the coated ribbon, measured with a photometer, being 0.68%.

By way of modification of the coating apparatus, the part of the hood 12 between the discharge end of conduit 16 and the chimney 17 was replaced by a sintered metal plate and dry air was delivered through this plate in such manner as to form an air cushion which isolated the reactive gas stream from the top of the hood. In that way fouling of the hood was prevented.

In a modification of the above coating process, air was fed together with titanium acetylacetonate vapour via the conduit 9, instead of separately via conduit 10. Conduit 10 was not used. The mixture of titanium acetylacetonate vapour and air was pre-heated to a temperature of 200° C. before entering the flow passage 5. A very high quality titanium dioxide undercoat was formed on the glass ribbon.

In another modification of the above mentioned process, which likewise gave good results, $SnBr_4$ was used instead of $SnCl_4$.

In another process according to the invention, the coating apparatus described with reference to the FIG- URE was utilised for coating sheets of glass while they were conducted through the coating stations by a conveyor at a speed of 10 meters per minute. In the first coating station a titanium oxide undercoating was formed on the glass wheets while they were at a temperature of 630° C. In the second coating station a tin dioxide coating was formed on the undercoating while the glass sheets were at a temperature of 585° C. In that manner the glass sheets were coated with an undercoating 300 Å in thickness and a tin oxide top coating 8400 Å in thickness. The coated sheets were found to be free from haze perceptible by the naked eye.

EXAMPLE 2

A coating apparatus was used like that represented in the accompanying drawing and described in Example 1, except that the conduits for feeding gaseous media into the flow passage 5 of the first coating zone were inclined at 30° to the horizontal. A stream of titanium acetylacetonate vapour in nitrogen as carrier gas produced as described in Example 1, was fed through conduit 9 at a temperature of 260° C. A titanium dioxide undercoating 400 Å in thickness was formed in the first coating zone.

At the second coating station, a stream of nitrogen at 500° C. was continuously fed into the flow passage 13 via conduit 15 for forming a pneumatic screen. A stream of tin tetrachloride vapour entrained in nitrogen formed as in Example 1, was introduced at 450° C. via the feed conduit 15. A mixture of air and HF vapour at 450° C. was continuously fed into the passage 13 via the conduit 16. In consequence, in the second coating zone a coating of $SnO_2$ doped with fluorine and having a thickness of 4000 Å, measured by a mechanical sensor, was formed which was free from perceptible haze.

In a modification of the foregoing process a mixture of $SnCl_4$ and $SbCl_5$ vapours was fed into the flow passage 13 through the feed conduit 15. This vapour mixture was formed by causing $SnCl_4$ and $SbCl_5$ vapours to be entrained by a stream of pre-heated nitrogen from a liquid comprising $SnCl_4$ and $SbCl_5$ in a volumetric ratio of 100:1. In this modified process air alone was supplied through the feed conduit 16.

In another modification, the second coating station of the coating apparatus was provided with only one feed conduit through which a mixture of $SnCl_4$ and $SbCl_5$ vapours was fed to the second coating zone. This feed conduit was disposed so that the discharge of the vapour stream from the conduit induced a flow of air along the flow passage 13 from its upstream end. The length of the flow passage was the same as in Example 1. With these two modifications the process resulted in the formation of a coating of $SnO_2$ 3500 Å in thickness on the 400 Å tin dioxide undercoating. The coatings were free from perceptible haze.

EXAMPLE 3

A coating apparatus was used like that shown in the accompanying drawing except that the feed conduits and hood in the first coating station were replaced by a spray gun mounted on a displacing mechanism which caused the gun to reciprocate to and fro across the full width of the glass ribbon path. The gun was oriented so that its spray axis was inclined downwardly and forwardly in the direction of movement of the glass ribbon to be coated, at an angle of 60° to the horizontal.

The gun was fed with a solution of titanium diisopropoxydiacetylacetonate in isopropyl alcohol formed as described in Example 1. The solution was supplied to the spray gun at ambient temperature. The gun and the feed passages conducting the liquid were heat insulated in order to avoid vaporisation of the feed prior to discharge from the gun. The liquid was sprayed towards a position along the path of the glass ribbon, which was travelling at a speed of 12 meters per minute, where the temperature of the glass was of the order of 600° C.

As a result, a coating of $TiO_2$ 300 Å in thickness was formed on the glass ribbon. Then an $SnO_2$ was formed on the undercoating in a manner analogous to that described in Example 1. The quantities of $SnCl_4$ and $H_2O$ were regulated so as in successive processing periods to form on the undercoating a coating of $SnO_2$ 5900 Å, and a coating of $SnO_2$ 9800 Å in thickness. Examination of the coated glass showed that the visible light diffusing power of the coatings, measured with a suitable photometer, was 0.78% for samples bearing the thinner tin oxide coating and 0.56% for samples bearing the thicker tin oxide coating. In both cases no haze could be detected with the naked eye.

EXAMPLE 4

A coating apparatus as described in Example 1 was used for coating a ribbon of glass, the temperature and speed of the glass through the coating stations being the same as in that Example.

In the first coating station, a pneumatic screen was formed by supplying nitrogen gas through conduit 8 as in Example 1. A stream of nickel acetylacetonate vapour at 250° C. was supplied through conduit 9. This vapour was obtained by passing a stream of nitrogen through heated nickel acetylacetonate powder, the nitrogen being pre-heated sufficiently to cause evolution and entrainment of nickel acetylacetonate vapour. Air at 250° C. was supplied through conduit 10. In consequence an undercoating of NiO 600 Å in thickness was formed on the glass ribbon. Then a coating of $SnO_2$ 7500 A in thickness was formed in the manner of Example 1. The coating was free from haze.

EXAMPLE 5

A coating apparatus as in Example 3 was employed for coating a heated glass ribbon. The spray gun was fed with a solution of zinc acetylacetonate in dimethylformamide and was directed towards a position along the glass ribbon path where the temperature of the glass was 600° C. A coating of zinc oxide 250 Å in thickness was formed on the glass ribbon. On the ZnO undercoating a coating of $SnO_2$ 7500 Å in thickness was formed in the same manner as in Example 1. The coatings were found to be free from haze.

EXAMPLE 6

A coating apparatus as described in Example 1 was used for coating a heated glass ribbon, the temperature and speed of which at the coating stations was the same as in that Example. In the first coating station, a pneumatic screen was formed by supplying nitrogen gas through conduit 8. Titanium tetraethylate vapour was supplied through conduit 9. A stream of dry air was supplied through conduit 10. The titanium tetraethylate vapour was generated by passing a stream of pre-heated nitrogen through liquid titanium tetraethylate. The ethylate vapour and likewise the dry air were supplied into the flow passage 5 at a temperature of 230° C. In consequence a coating of $TiO_2$ 400 Å in thickness was formed on the glass. In the second coating station, at the entrance to which the glass had a temperature of 580° C., a SnO₂ coating was formed in a manner analogous to Example 1, the quantities of SnCl₄ and water vapour being regulated so as to obtain a SnO₂ coating 8400 Å in thickness. The coating was found to be free from haze.

Similar results to those obtained in the foregoing example were achieved by using titanium tetraisopropylate instead of titanium tetraethylate. Likewise similar results were obtained when using titanium tetrabutylate instead of the tetraethylate.

What is claimed is:

1. A process for forming a tin oxide coating on a hot glass substrate by chemical reaction of tin halide supplied in the vapour phase comprising: conveying the hot substrate through a first coating zone in which it is contacted with an acetylacetonate of titanium, nickel or zinc to cause deposition of a metal oxide undercoating on the substrate, and immediately conveying the still hot substrate through a second coating zone in which the metal oxide coating is contacted by a gaseous medium comprising a tin halide to cause deposition of a coating of tin oxide.

2. A process according to claim 1, wherein the first and second coating zones are arranged close together along the path of conveyance of the substrate so that deposition of the coating of tin oxide on any given region along the substrate occurs immediately after deposition of the undercoating on that region.

3. A process according to claim 1 or 2, wherein in said first coating zone the hot substrate is contacted with a titanium acetylacetonate.

4. A process according to claim 1 or 2, wherein in the second coating zone the undercoating is contacted by tin tetrachloride.

5. A process according to claim 1 or 2, wherein the gaseous medium comprising a tin halide is caused to flow along the undercoated substrate face as a substantially turbulence-free layer.

6. A process according to claim 1 or 2, wherein the acetylacetonate is supplied to the substrate in the gaseous phase.

7. A process according to claim 6, wherein the acetylacetonate is caused to flow along the glass substrate face to be coated as a substantially turbulence free layer.

8. A process according to claim 7, wherein the acetylacetonate is caused to flow in contact with the substrate face as a substantially turbulence-free layer along a flow passage which is defined in part by said face and which leads towards an exhaust ducting via which residual gaseous medium is drawn away from such face.

9. A process according to claim 8, wherein the height of said flow passage measured normally to the substrate face is at no point in excess of 40 mm.

10. A process according to claim 6 wherein the acetylacetonate and the gaseous medium comprising a tin halide are caused to flow along successive portions of a flow passage defined in part by the substrate face to be coated, and gaseous medium remaining from the first coating zone is withdrawn from such passage at a position between the two coating zones.

11. A process according to claim 10, wherein residual gaseous medium at the downstream end of the second coating zone is withdrawn away from the coated substrate.

12. A process according to claim 6 wherein the acetylacetonate is fed towards the first coating zone as a gas stream which is directed along a path which is inclined towards the substrate face to be coated.

13. A process according to claim 12, wherein said gas stream is inclined to said face at an angle of 45° or less.

14. A process according to claim 6 wherein the acetylacetonate is supplied to the first coating zone together with oxygen.

15. A process according to claim 1 or 2, wherein the acetylacetonate is fed in solution to the first coating zone, the solution being in the form of droplets.

16. A process according to claim 1 or 2, wherein the metal oxide undercoating deposited on the substrate is less than 2000 Å in thickness.

17. A process according to claim 16, wherein the metal oxide undercoating is less than 500 Å in thickness.

18. A process according to claim 1 or 2, wherein the temperature of the glass substrate at the two coating zones is in the range 520° to 630° C.

19. A process according to claim 1 or 2, wherein the temperature of the coated substrate at the second coating zone is above 550° C.

20. A process according to claim 6 additionally comprising supplying a vaporous undercoat precursor to the first coating zone in an inert gas, at a temperature in the range 200° to 300° C.

21. A process according to claim 6 additionally comprising supplying a vaporous undercoat precursor to the first coating zone in a carrier stream of air at a temperature low enough to avoid premature reactions.

22. A process according to claim 1 or 2, wherein the gaseous medium which is brought into contact with the undercoated substrate in the second coating zone contains tin tetrachloride in a concentration corresponding to a partial pressure of at least $2.5 \times 10^{-3}$ atm. and contains water vapour in a concentration corresponding to a partial pressure of at least $10 \times 10^{-3}$ atm., and has been pre-heated to a temperature of at least 300° C. and wherein the temperature of the glass at the second coating zone is above 550° C.

23. A process according to claim 22, wherein the said partial pressure of the tin tetrachloride is in the range from $2.5 \times 10^{-3}$ to $10^{-2}$ atm.

24. A process according to claim 1 or 2, performed for coating a continuous ribbon of glass in the course of its conveyance from a flat glass forming station.

25. A process according to claim 24, wherein the glass substrate is a ribbon of float glass travelling from a float tank.

26. A process according to claim 1, wherein the first coating zone the hot substrate is contacted with an acetylacetonate of titanium, nickel, or zinc.

* * * * *